(12) United States Patent
Nagatomo et al.

(10) Patent No.: US 10,183,360 B2
(45) Date of Patent: Jan. 22, 2019

(54) HERMETIC SEALING CAP, ELECTRONIC COMPONENT HOUSING PACKAGE, AND METHOD FOR MANUFACTURING HERMETIC SEALING CAP

(71) Applicant: HITACHI METALS, LTD., Tokyo (JP)

(72) Inventors: Kazuya Nagatomo, Izumi (JP); Ken Asada, Izumi (JP)

(73) Assignee: HITACHI METALS, LTD., Tokyo (JP)

( * ) Notice: Subject to any disclaimer, the term of this patent is extended or adjusted under 35 U.S.C. 154(b) by 551 days.

(21) Appl. No.: 14/472,732

(22) Filed: Aug. 29, 2014

(65) Prior Publication Data

US 2015/0098171 A1 Apr. 9, 2015

(30) Foreign Application Priority Data

Oct. 3, 2013 (JP) .................................. 2013-208397

(51) Int. Cl.
  *H05K 5/06* (2006.01)
  *H01L 23/10* (2006.01)
  *B23K 31/02* (2006.01)

(52) U.S. Cl.
  CPC .............. *B23K 31/02* (2013.01); *H01L 23/10* (2013.01); *H01L 2224/16225* (2013.01); *H01L 2924/0002* (2013.01)

(58) Field of Classification Search
  CPC ........... H05K 5/069; H05K 5/03; H01L 23/10
  USPC .......................... 361/518, 536, 516; 174/50.5
  See application file for complete search history.

(56) References Cited

U.S. PATENT DOCUMENTS

| 7,790,988 | B2 | 9/2010 | Tanaka et al. |
| 7,842,891 | B2 | 11/2010 | Kasai et al. |
| 2009/0301749 | A1* | 12/2009 | Tanaka ................ H01L 21/4817 174/50.5 |

FOREIGN PATENT DOCUMENTS

| JP | 03011653 A | 1/1991 |
| JP | 4-96256 A | 3/1992 |
| JP | 9-199622 A | 7/1997 |
| JP | 09199622 A * | 7/1997 |
| JP | 2009-200093 A | 9/2009 |
| JP | 4630338 B2 | 2/2011 |
| WO | 2006/077974 A1 | 7/2006 |

(Continued)

OTHER PUBLICATIONS

Taiwanese Office Action dated Sep. 11, 2015 issued in counterpart Taiwanese patent application No. 103130363, with English translation. (11 pages).

(Continued)

*Primary Examiner* — Eric Thomas
*Assistant Examiner* — Arun Ramaswamy
(74) *Attorney, Agent, or Firm* — Westerman, Hattori, Daniels & Adrian, LLP

(57) ABSTRACT

A hermetic sealing cap includes a base material, a first plated layer formed on the base material, and a second plated layer formed on the first plated layer. A surface of the base material is sectioned into a first region, a second region not adjacent to the first region inside the first region, a third region adjacent to the first region inside the first region, and a fourth region adjacent to the first region outside the first region. In the third region and the fourth region, the first plated layer is exposed to be oxidized.

16 Claims, 4 Drawing Sheets

(56) References Cited

FOREIGN PATENT DOCUMENTS

WO       2007/094284 A1    8/2007

OTHER PUBLICATIONS

Office Action dated Sep. 16, 2015, issued in counterpart Korean Application No. 10-2014-0111429, with English translation. (16 pages).
Office Action dated Dec. 28, 2016, issued in counterpart Chinese Patent Application No. 201410513866.2, with English translation. (23 pages).
Japanese Office Action dated Jul. 11, 2017, issued in counterpart Japanese Patent Application No. 2013-208397 with English translation.
Chinese Office Action dated Jul. 13, 2017, issued in counterpart Chinese Patent Application No. 201410513866.2 with English translation.
Office Action dated Dec. 27, 2017, issued in counterpart Chinese Application No. 201410513866.2, with English translation. (19 pages).
Office Action dated Oct. 31, 2017, issued in counterpart Japanese Application No. 2013-208397, with English translation. (8 pages).

* cited by examiner

HERMETIC SEALING CAP, ELECTRONIC COMPONENT HOUSING PACKAGE, AND METHOD FOR MANUFACTURING HERMETIC SEALING CAP

BACKGROUND OF THE INVENTION

Field of the Invention

The present invention relates to a hermetic sealing cap, an electronic component housing package, and a method for manufacturing a hermetic sealing cap, and more particularly, it relates to a hermetic sealing cap bonded with an electronic component housing member through solder, an electronic component housing package employing the hermetic sealing cap, and a method for manufacturing the hermetic sealing cap.

Description of the Background Art

A hermetic sealing cap bonded with an electronic component housing member through solder is known in general, as disclosed in Japanese Patent Laying-Open No. 4-096256 (1992), for example.

FIG. 5 of the aforementioned Japanese Patent Laying-Open No. 4-096256 discloses a metal hermetic sealing cap made of a material obtained by cladding Alloy 42(42 Ni—Fe alloy) and nickel, bonded to a package. In an entire region inside a ring-shaped sealing region formed at and near an outer end of a sealing surface of a cap body of this metal hermetic sealing cap, the nickel is oxidized by a laser. Thus, the wettability to solder is reduced in the entire region inside the ring-shaped sealing region.

Although in the metal hermetic sealing cap described in the aforementioned Japanese Patent Laying-Open No. 4-096256, the nickel in the entire region inside the ring-shaped sealing region is oxidized, the nickel in the sealing region is not oxidized, so that the wettability to solder remains high. When the metal hermetic sealing cap is bonded to the package, therefore, part of melted solder may protrude outward from the outer end and ascend the outer surface of the metal hermetic sealing cap. In this case, the amount of solder in the sealing region is reduced, and hence the sealability is not sufficiently ensured.

SUMMARY OF THE INVENTION

The present invention has been proposed in order to solve the aforementioned problem, and an object of the present invention is to provide a hermetic sealing cap capable of suppressing a reduction in the amount of solder in a region bonded with an electronic component housing member by suppressing spread of part of melted solder to the outer surface of the hermetic sealing cap, an electronic component housing package employing the hermitic sealing cap, and a method for manufacturing the hermetic sealing cap.

A hermetic sealing cap according to a first aspect of the present invention is employed for an electronic component housing package including an electronic component housing member configured to house an electronic component and includes a base material, a first plated layer formed on a surface of the base material, and a second plated layer formed on a surface of the first plated layer. The surface of the base material is sectioned into a first region bonded with the electronic component housing member through solder, a second region not adjacent to the first region inside the first region, a third region adjacent to the first region inside the first region, and a fourth region adjacent to the first region outside the first region in a plan view, and in the third region and the fourth region, the first plated layer is exposed to be oxidized. The "outside" denotes the side of an outer end of the hermetic sealing cap in the plan view, and the "inside" denotes the center side of the hermetic sealing cap in the plan view.

In the aforementioned hermetic sealing cap according to the first aspect, the first region and the fourth region are preferably ring-shaped in the plan view, and a separate distance between the outer peripheral edge and the inner peripheral edge of the fourth region that is ring-shaped is preferably smaller than a separate distance between the outer peripheral edge and the inner peripheral edge of the first region that is ring-shaped.

In the aforementioned hermetic sealing cap according to the first aspect, the third region and the fourth region are preferably ring-shaped in the plan view, and a separate distance between the outer peripheral edge and the inner peripheral edge of the fourth region that is ring-shaped is preferably smaller than a separate distance between the outer peripheral edge and the inner peripheral edge of the third region that is ring-shaped.

In the aforementioned hermetic sealing cap according to the first aspect, the first region and the third region are preferably ring-shaped in the plan view, and a separate distance between the outer peripheral edge and the inner peripheral edge of the third region that is ring-shaped is preferably larger than a separate distance between the outer peripheral edge and the inner peripheral edge of the first region that is ring-shaped.

In the aforementioned hermetic sealing cap according to the first aspect, in a region inside the first region, a plane area occupied by the second region is preferably larger than a plane area occupied by the third region.

In the aforementioned hermetic sealing cap according to the first aspect, in the plan view, the base material preferably has a quadrilateral shape, the third region is preferably ring-shaped, and a protrusion region protruding toward a corner of the base material is preferably formed in a region of the third region corresponding to the corner.

In the aforementioned hermetic sealing cap according to the first aspect, the first plated layer is preferably a Ni plated layer, and the second plated layer is preferably a Au plated layer. In this case, the solder made of Au—Sn alloy is preferably arranged on a surface of the second plated layer of the first region.

An electronic component housing package according to a second aspect of the present invention includes a hermetic sealing cap including a base material, a first plated layer formed on a surface of the base material, and a second plated layer formed on a surface of the first plated layer, in which the surface of the base material is sectioned into a first region bonded with an electronic component housing member through solder, a second region not adjacent to the first region inside the first region, a third region adjacent to the first region inside the first region, and a fourth region adjacent to the first region outside the first region in a plan view, and in the third region and the fourth region, the first plated layer is exposed to be oxidized, and the electronic component housing member sealed by the hermetic sealing cap, housing an electronic component.

In the aforementioned electronic component housing package according to the second aspect, the first region and the fourth region are preferably ring-shaped in the plan view, and a separate distance between the outer peripheral edge and the inner peripheral edge of the fourth region that is ring-shaped is preferably smaller than a separate distance between the outer peripheral edge and the inner peripheral edge of the first region that is ring-shaped.

In the aforementioned electronic component housing package according to the second aspect, the third region and the fourth region are preferably ring-shaped in the plan view, and a separate distance between the outer peripheral edge and the inner peripheral edge of the fourth region that is ring-shaped is preferably smaller than a separate distance between the outer peripheral edge and the inner peripheral edge of the third region that is ring-shaped.

In the aforementioned electronic component housing package according to the second aspect, the first region and the third region are preferably ring-shaped in the plan view, and a separate distance between the outer peripheral edge and the inner peripheral edge of the third region that is ring-shaped is preferably larger than a separate distance between the outer peripheral edge and the inner peripheral edge of the first region that is ring-shaped.

In the aforementioned electronic component housing package according to the second aspect, in a region inside the first region, a plane area occupied by the second region is preferably larger than a plane area occupied by the third region.

In the aforementioned electronic component housing package according to the second aspect, in the plan view, the base material preferably has a quadrilateral shape, the third region is preferably ring-shaped, and a protrusion region protruding toward a corner of the base material is preferably formed in a region of the third region corresponding to the corner.

In the aforementioned electronic component housing package according to the second aspect, the first plated layer is preferably a Ni plated layer, and the second plated layer is preferably a Au plated layer. In this case, the solder made of Au—Sn alloy is preferably arranged on a surface of the second plated layer of the first region.

A method for manufacturing a hermetic sealing cap according to a third aspect of the present invention is a method for manufacturing a hermetic sealing cap employed for an electronic component housing package including an electronic component housing member configured to house an electronic component, including steps of preparing a base material, forming a first plated layer on a surface of the base material, forming a second plated layer on a surface of the first plated layer, and removing the second plated layer of a third region adjacent to a first region by a laser and removing the second plated layer of a fourth region outside the first region by the laser while leaving the second plated layer of a second region not adjacent to the first region in a region inside the first region bonded with the electronic component housing member through solder to expose the surface of the first plated layer of the third region and the fourth region and oxidize the surface of the first plated layer that is exposed.

In the aforementioned method for manufacturing a hermetic sealing cap according to the third aspect, the step of exposing the surface of the first plated layer and oxidizing the surface of the first plated layer that is exposed preferably includes a step of oxidizing the surface of the first plated layer that is exposed by heat generated by laser emission.

In the aforementioned method for manufacturing a hermetic sealing cap according to the third aspect, the step of forming the second plated layer preferably includes a step of forming the second plated layer such that the thickness of the second plated layer is smaller than the thickness of the first plated layer.

In the aforementioned method for manufacturing a hermetic sealing cap according to the third aspect, the step of exposing the surface of the first plated layer and oxidizing the surface of the first plated layer that is exposed preferably includes a step of removing the second plated layer of the third region adjacent to the inside of the first region and the second plated layer of the fourth region outside the first region by the laser to form the first region and the fourth region in a ring shape in a plan view such that a separate distance between the outer peripheral edge and the inner peripheral edge of the fourth region is smaller than a separate distance between the outer peripheral edge and the inner peripheral edge of the first region.

According to the present invention, as hereinabove described, the first plated layer is exposed to be oxidized in the fourth region adjacent to the first region outside the first region, whereby the wettability to solder can be reduced in the fourth region outside the first region, and hence spread of the solder can be suppressed. Thus, part of melted solder can be inhibited from reaching the outer surface of the hermetic sealing cap. Consequently, spread of the part of the melted solder to the outer surface of the hermetic sealing cap can be suppressed when the hermetic sealing cap is bonded to the electronic component housing member, and hence a reduction in the amount of the solder in a region bonded with the electronic component housing member can be suppressed. Thus, the sealability of the electronic component housing package can be sufficiently ensured.

Furthermore, a region inside the first region is sectioned into the second region not adjacent to the first region and the third region adjacent to the first region, and the first plated layer is exposed to be oxidized in the third region. Thus, the wettability to solder can be reduced also in the third region inside the first region, and hence spread of the solder can be suppressed. Thus, the reduction in the amount of the solder in the region bonded with the electronic component housing member can be suppressed. In addition, the second plated layer of the second region not adjacent to the first region is left, whereby the appearance of a defect on a surface of the hermetic sealing cap can be suppressed by covering the first plated layer with the second plated layer in the second region not adjacent to the first region even in the case where there is a defect such as a pinhole in the first plated layer of the second region. Thus, the corrosion resistance can be improved in the second region not adjacent to the first region (inside the third region) while the spread of the solder is suppressed in the third region adjacent to the first region inside the first region bonded with the electronic component housing member through the solder.

Furthermore, in the aforementioned method for manufacturing a hermetic sealing cap according to the third aspect, the second plated layer of the third region adjacent to the first region and the second plated layer of the fourth region outside the first region are removed by the laser, whereby the second plated layer of the third region and the second plated layer of the fourth region can be easily removed without forming masks or the like on portions where the second plated layer is not removed, and corrosion of the first plated layer and the second plated layer caused by a reagent employed to remove the masks can be suppressed. Furthermore, the surface of the first plated layer of the third region and the fourth region is exposed by the laser, and the exposed surface of the first plated layer is oxidized, whereby no step of oxidizing the surface of the first plated layer exposed separately may be required, and hence the manufacturing process can be simplified.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are hereinafter described with reference to the drawings.

(First Embodiment)

The structure of an electronic component housing package 100 according to a first embodiment of the present invention is now described with reference to FIGS. 1 to 4.

Figure 1:
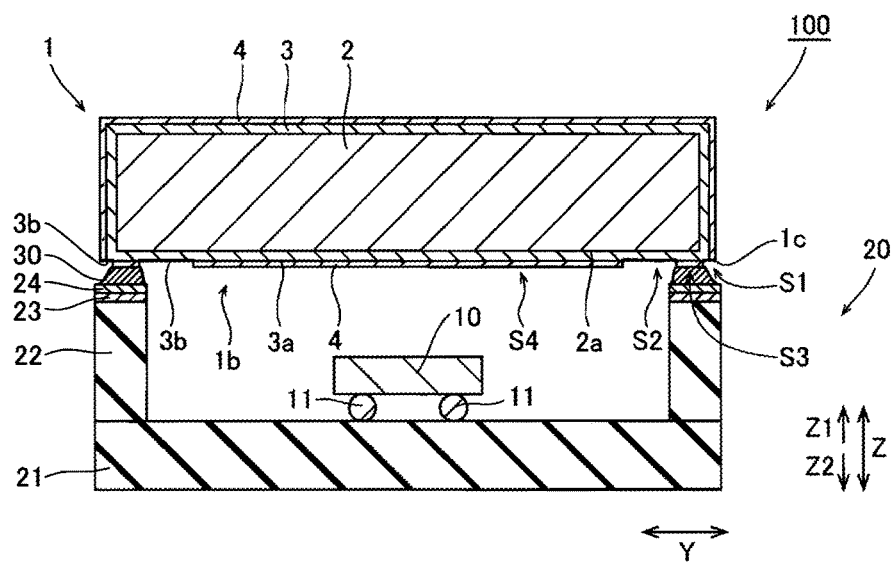
FIG. 1 is a sectional view showing the overall structure of an electronic component housing package according to a first embodiment of the present invention.

The electronic component housing package 100 according to the first embodiment of the present invention includes a hermetic sealing cap 1, an electronic component 10 such as a crystal oscillator, and an electronic component housing member 20 for housing the electronic component 10, as shown in FIG. 1.

The electronic component housing member 20 includes a ceramic substrate 21 and a ceramic frame body 22 each made of an insulating material such as alumina. The ceramic substrate 21 is a plate-like member, and the ceramic frame body 22 is arranged along the outer periphery on the upper surface of the ceramic substrate 21 and extends upward (Z1 side) at a prescribed height. The electronic component 10 is mounted through bumps 11 on the ceramic substrate 21 in a housing space surrounded by the ceramic frame body 22. A tungsten layer 23 and a Ni—Co alloy layer 24 are formed on the upper surface of the ceramic frame body 22. The Ni—Co alloy layer 24 on the upper surface of the ceramic frame body 22 is bonded to the hermetic sealing cap 1 through a solder layer 30 made of a Au—Sn alloy containing about 80 mass % of Au.

Figure 2:
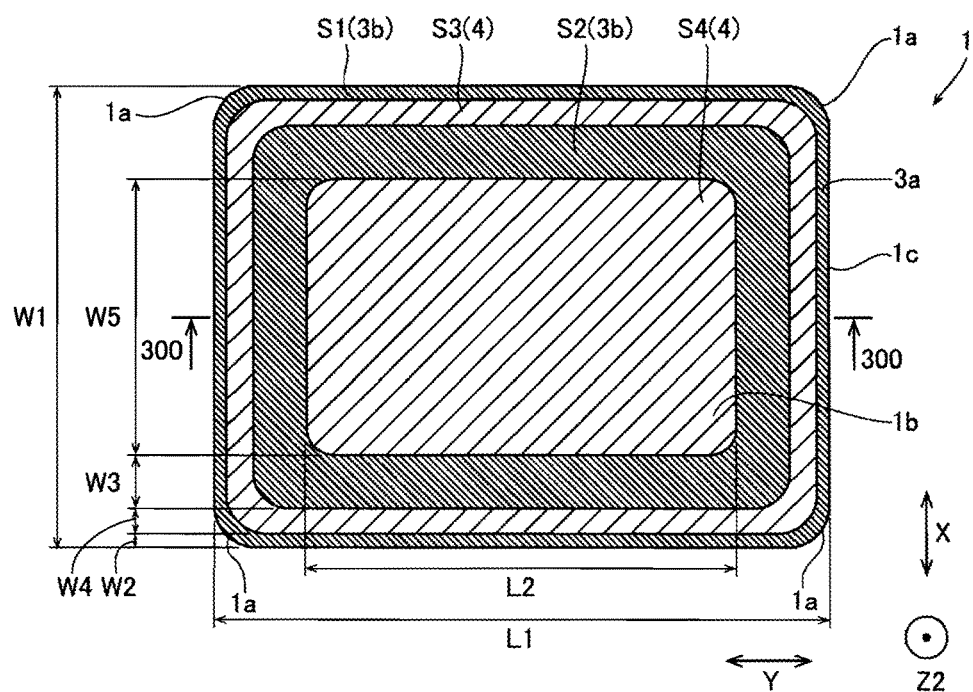
FIG. 2 is a plan view showing a hermetic sealing cap according to the first embodiment of the present invention.
Figure 3:
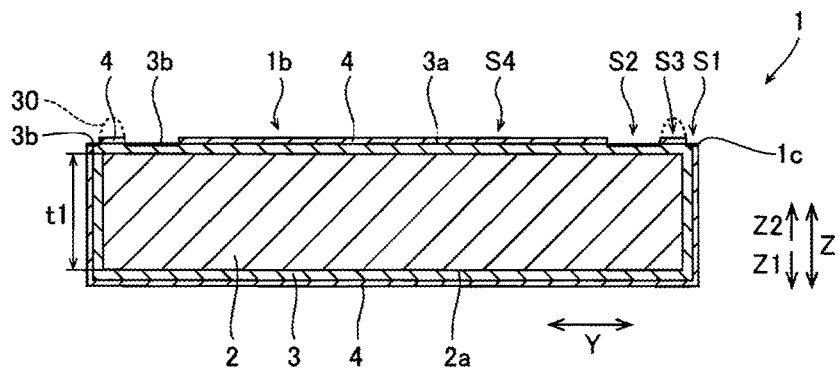
FIG. 3 is a sectional view taken along the line 300-300 in FIG. 2.

The hermetic sealing cap 1 is made of a rectangular (quadrilateral) flat plate, and the four corners 1a thereof are R-chamfered, as shown in FIG. 2. The hermetic sealing cap 1 includes a base material 2 made of Fe—Ni—Co alloy, a Ni plated layer 3 whose surface 3a is exposed in oxidized regions S1 and S2, formed on a surface 2a of the base material 2, and a Au plated layer 4 formed on the surface 3a of the Ni plated layer 3 in a solder region S3 and a plated region S4, as shown in FIG. 3. The Au plated layer 4 is formed such that the wettability thereof to solder (Au—Sn alloy) of the solder layer 30 is higher than that of the Ni plated layer 3. The Ni plated layer 3 and the Au plated layer 4 are examples of the "first plated layer" and the "second plated layer" in the present invention, respectively.

As shown in FIG. 2, the surface 2a of the base material 2 is sectioned into four regions of the oxidized region S1, the oxidized region S2, the solder region S3, and the plated region S4. Specifically, the oxidized region S1 is formed in a ring shape adjacent to the outside of the ring-shaped solder region S3, and the oxidized region S2 is formed in a ring shape adjacent to the inside of the ring-shaped solder region S3. The related region S4 is rectangularly formed adjacent to the inside of the oxidized region S2 but not adjacent to the solder region S3 while being formed inside the solder region S3. In other words, the oxidized region S1, the solder region S3, the oxidized region S2, and the plated region S4 are formed sequentially from the outer end 1c (outside) toward the inside in the hermetic sealing cap 1. The "outside" denotes the side of the outer end 1c of the hermetic sealing cap 1 in a plan view, and the "inside" denotes the center side of the hermetic sealing cap 1 in the plan view.

The base material 2 is in the form of a flat plate and has a width W1 of about 1.9 mm in the short-side direction (direction X), a length L1 of about 2.4 mm in the longitudinal direction (direction Y), and a thickness t1 (see FIG. 3) of about 0.1 mm in the thickness direction (direction Z). As shown in FIG. 1, the base material 2 is formed to be slightly smaller than the hermetic electronic component housing member 20. Thus, when the hermetic sealing cap 1 and the electronic component housing member 20 are bonded to each other, protrusion of the hermetic sealing cap 1 in the longitudinal direction and short-side direction of the electronic component housing member 20 can be suppressed.

The Ni plated layer 3 is formed to surround the entire surface 2a including not only a surface of the base material 2 closer to a sealing surface 1b but also a surface (surface on a Z1 side) on the outside opposed to the sealing surface 1b and four outer surfaces, as shown in FIG. 3. In other words, the base material 2 is completely covered with the Ni plated layer 3.

Figure 4:
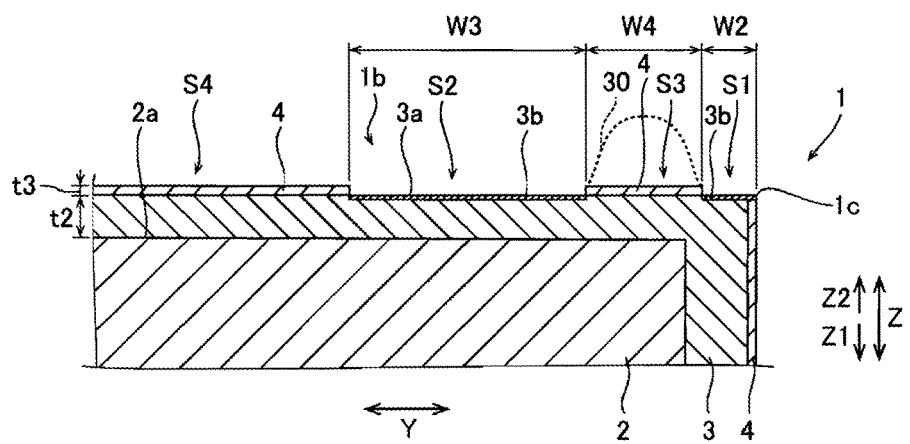
FIG. 4 is an enlarged sectional view showing the periphery of an oxidized region of the hermetic sealing cap according to the first embodiment of the present invention.

As shown in FIG. 4, the Ni plated layer 3 is formed to have a thickness t2 of at least about 2 μm and not more than about 3 μm, and the Au plated layer 4 is formed to have a thickness t3 of about 0.02 μm. The sizes (thicknesses t2 and t3) of the Ni plated layer 3 and the Au plated layer 4 are negligibly small as compared with the size of the base material 2, and hence the size of the hermetic sealing cap 1 is substantially equal to the size of the base material 2. In FIGS. 1, 3, and 5 to 7, the thickness of the Ni plated layer 3 and the thickness of the Au plated layer 4 are exaggeratingly illustrated for the sake of ease of understanding.

According to the first embodiment, in the ring-shaped oxidized region S1 located outside the solder region S3, the Au plated layer 4 outside the solder region S3 is removed in a ring shape, whereby the surface 3a of the Ni plated layer 3 is exposed, and an oxide film layer 3b is formed by oxidizing the exposed surface 3a of the Ni plated layer 3, as shown in FIG. 2. Similarly, in the ring-shaped oxidized region S2 located inside the solder region S3, the Au plated layer 4 inside the solder region S3 is removed in a ring shape, whereby the surface 3a of the Ni plated layer 3 is exposed, and an oxide film layer 3b is formed by oxidizing the exposed surface 3a of the Ni plated layer 3. At this time, the Au plated layer 4 outside and inside the solder region S3 is removed in the ring shape while the Au plated layer 4 of the plated region S4 located inside the solder region S3, not adjacent to the solder region S3 is left. The oxide film layer 3b of the exposed Ni plated layer 3 is oxidized, and hence the wettability thereof to the solder (Au—Sn alloy) is further reduced than that of the unoxidized surface 3a of the Ni plated layer 3. The wettability of the oxide film layer 3b to the solder is lower than that of the Au plated layer 4. The oxidized regions S1 and S2 are examples of the "fourth region" and the "third region" in the present invention, respectively.

The ring-shaped oxidized region S1 is formed such that the width W2 thereof is at least about 30 μm and not more than about 60 μm, and the ring-shaped oxidized region S2 is formed such that the width W3 thereof is about 100 μm. In other words, the width W3 of the ring-shaped oxidized region S2 is larger than the width W2 of the ring-shaped oxidized region S1. In this embodiment, the width of the ring-shaped region denotes a separate distance between the outer peripheral edge (peripheral edge closer to the outer end 1c) and the inner peripheral edge (peripheral edge opposite to the outer end 1c) of the ring-shaped region.

As shown in FIG. 4, in the solder region S3 adjacent to the inside of the oxidized region S1 and adjacent to the outside of the oxidized region S2, the Au plated layer 4 is formed on the surface 3a of the Ni plated layer 3, and the solder layer 30 made of solder of Au—Sn alloy is arranged on a surface of the Au plated layer 4. Thus, in the solder region S3, the electronic component housing member 20 is bonded to the hermetic sealing cap 1 through the Au plated layer 4 on the solder layer 30, as shown in FIG. 1. The solder region S3 is an example of the "first region" in the present invention.

As shown in FIG. 2, the width W4 of the ring-shaped solder region S3 is about 80 μm and is substantially constant in a region excluding regions corresponding to corners 1a. The width W2 of the ring-shaped oxidized region S1 is smaller than the width W4 of the ring-shaped solder region S3. The width W3 of the ring-shaped oxidized region S2 is larger than the width W4 of the ring-shaped solder region S3. The width of the solder region S3 in the regions corresponding to the corners 1a is slightly larger than the width W4.

As shown in FIG. 4, inside the solder region S3, the Au plated layer 4 is formed on the surface 3a of the Ni plated layer 3 in the plated region S4 not adjacent to the solder region S3 but adjacent to the inside of the oxidized region S2. In the plated region S4 unlike the solder region S3, no solder layer 30 is arranged on the surface of the Au plated layer 4. The plated region S4 is substantially rectangularly formed in the plan view, and both the width W5 thereof in the short-side direction (direction x) and the length L2 thereof in the longitudinal direction (direction Y) are larger than the width W2 of the oxidized region S1, the width W3 of the oxidized region S2, and the width W4 of the solder region S3, as shown in FIG. 2. The plane area occupied by the plated region S4 is larger than the plane area occupied by the oxidized region S2. The plated region S4 is an example of the "second region" in the present invention.

In the regions corresponding to the R-chamfered corners 1a, boundaries between the oxidized region S1, the oxidized region S2, the solder region S3, and the plated region S4 are curved to correspond to the R-chamfered corners 1a.

According to the first embodiment, as hereinabove described, the oxide film layer 3b lower in wettability to solder than the Au plated layer 4 is formed by removing the Au plated layer 4 in the ring shape to expose the surface 3a of the Ni plated layer 3 and oxidize the exposed surface 3a of the Ni plated layer 3 in the oxidized region S1 outside the solder region S3. Thus, the wettability to solder can be reduced in the oxidized region S1 located outside the solder region S3, and hence spread of the solder of the solder layer 30 can be suppressed. Therefore, part of the melted solder can be inhibited from reaching the outer surface of the hermetic sealing cap 1. Consequently, spread of the part of the melted solder to the outer surface of the hermetic sealing cap 1 can be suppressed when the hermetic sealing cap 1 is bonded to the electronic component housing member 20, and hence a reduction in the amount of the solder of the solder region S3 can be suppressed. Thus, the sealability of the electronic component housing package 100 can be sufficiently ensured.

According to the first embodiment, the oxide film layer 3b lower in wettability to solder than the Au plated layer 4 is formed by sectioning a region inside the solder region S3 into the plated region S4 not adjacent to the solder region S3 inside the solder region S3 and the oxidized region S2 adjacent to the solder region S3 and removing the Au plated layer 4 inside the ring-shaped solder region S3 while leaving the Au plated layer 4 of the plated region S4 not adjacent to the solder region S3 to expose the surface 3a of the Ni plated layer 3 and oxidize the exposed surface 3a of the Ni plated layer 3 in the oxidized region S2 inside the solder region S3. Thus, the wettability to solder can be reduced also in the oxidized region S2 inside the solder region S3, and hence the spread of the solder of the solder layer 30 can be suppressed. Thus, the reduction in the amount of the solder of the solder region S3 can be suppressed. Furthermore, the Au plated layer 4 of the plated region S4 not adjacent to the solder region S3 is left, whereby the appearance of a defect on the sealing surface 1b can be suppressed by covering the Ni plated layer 3 with the Au plated layer 4 in the plated region S4 not adjacent to the solder region S3 even in the case where there is a defect such as a pinhole in the Ni plated layer 3 of the plated region S4. Thus, the corrosion resistance can be improved in the plated region S4 not adjacent to the solder region S3 (inside the oxidized region S2) while the spread of the solder is suppressed in the oxidized region S2 adjacent to the solder region S3 inside the solder region S3.

According to the first embodiment, the width W2 (at least about 30 μm and not more than about 60 μm) of the ring-shaped oxidized region S1 outside the solder region S3 is rendered smaller than the width W4 (about 80 μm) of the ring-shaped solder region S3, whereby the solder region S3 can be provided at a position closer to the outside (side of the outer end 1c), and hence an increase in the size of the hermetic sealing cap 1 can be suppressed while a large region (the oxidized region S2 and the plated region S4) inside the solder region S3 is ensured. Furthermore, the solder region S3 can be sufficiently ensured, and hence the hermetic sealing cap 1 and the electronic component housing member 20 can be bonded to each other in a wide range. Consequently, the sealability of the electronic component housing package 100 can be reliably ensured.

According to the first embodiment, the width W3 (about 100 μm) of the ring-shaped oxidized region S2 inside the solder region S3 is rendered larger than the width W2 (at least about 30 μm and not more than about 60 μm) of the ring-shaped oxidized region S1 outside the solder region S3, whereby the oxidized region S1 outside the solder region S3 can be reduced in size, and hence the increase in the size of the hermetic sealing cap 1 can be suppressed. Furthermore, the width W3 of the oxidized region S2 adjacent to the inside of the solder region S3 can be sufficiently ensured, and hence spread of the solder of the solder layer 30 to the plated region S4 beyond the oxidized region S2 can be suppressed. Thus, the reduction in the amount of the solder of the solder region S3 can be further suppressed, and the solder spread to the inside of the hermetic sealing cap 1 can be inhibited from being put on the electronic component 10 or the like.

According to the first embodiment, the width W3 (about 100 µm) of the ring-shaped oxidized region S2 inside the solder region S3 is rendered larger than the width W4 (about 80 µm) of the ring-shaped solder region S3, whereby the width W3 of the oxidized region S2 can be sufficiently ensured, and hence the spread of the solder of the solder layer 30 to the plated region S4 beyond the oxidized region S2 can be effectively suppressed.

According to the first embodiment, inside the solder region S3, the plane area occupied by the plated region S4 inside the oxidized region S2 is rendered larger than the plane area occupied by the oxidized region S2, whereby an area occupied by the plated region S4 in the solder region S3 can be increased, and hence an area of the Ni plated layer 3 covered with the Au plated layer 4 can be increased. Thus, the corrosion resistance can be improved in a wide range inside the solder region S3.

According to the first embodiment, the hermetic sealing cap 1 includes the Ni plated layer 3 whose surface 3a is exposed in the oxidized regions S1 and S2, formed on the surface 2a of the base material 2 and the Au plated layer 4 formed on the surface 3a of the Ni plated layer 3 in the solder region S3 and the plated region S4. Thus, the surface 3a of the Ni plated layer 3 is easily oxidized, and the wettability to solder can be reduced in the oxidized regions S1 and S2.

According to the first embodiment, in the solder region S3, the Au plated layer 4 is formed on the surface 3a of the Ni plated layer 3, and the solder layer 30 made of solder of Au—Sn alloy is arranged on the surface of the Au plated layer 4. Thus, the solder layer 30 made of solder of Au—Sn alloy containing Au that is the same as that of the Au plated layer 4 is arranged on the surface of the Au plated layer 4 of the solder region S3, and hence the wettability to solder and the adhesion can be further improved in the Au plated layer 4.

A method for manufacturing the hermitic sealing cap 1 and the electronic component housing package 100 according to the first embodiment of the present invention is now described with reference to FIGS. 1, 2, and 4 to 7.

Figure 5:
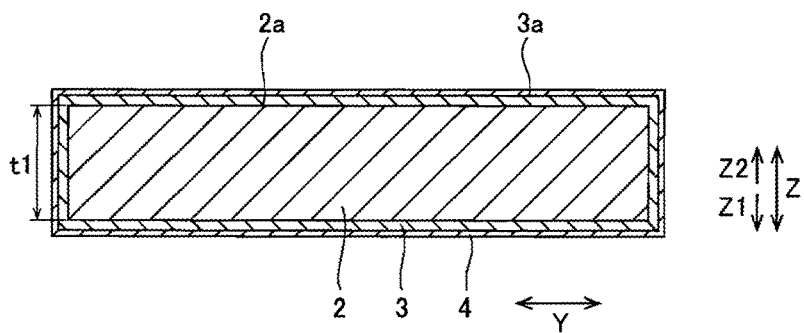
FIG. 5 is a sectional view for illustrating a method for manufacturing the hermetic sealing cap according to the first embodiment of the present invention.

As shown in FIG. 5, a plate-like coil made of Fe—Ni—Co alloy is punched out by pressing, whereby the base material 2 made of Fe—Ni—Co alloy having the width W1 (see FIG. 2) of about 1.9 mm in the short-side direction (direction X), the length L1 (see FIG. 2) of about 2.4 mm in the longitudinal direction (direction Y), and the thickness t1 (see FIG. 3) of about 0.1 mm in the thickness direction (direction Z) is prepared. The Ni plated layer 3 having the thickness t2 (see FIG. 4) of at least about 2 µm and not more than about 3 µm is formed on the entire surface 2a of this base material 2, and the Au plated layer 4 having the thickness t3 (see FIG. 4) of about 0.02 µm is formed on the entire surface 3a of the Ni plated layer 3.

Figure 6:
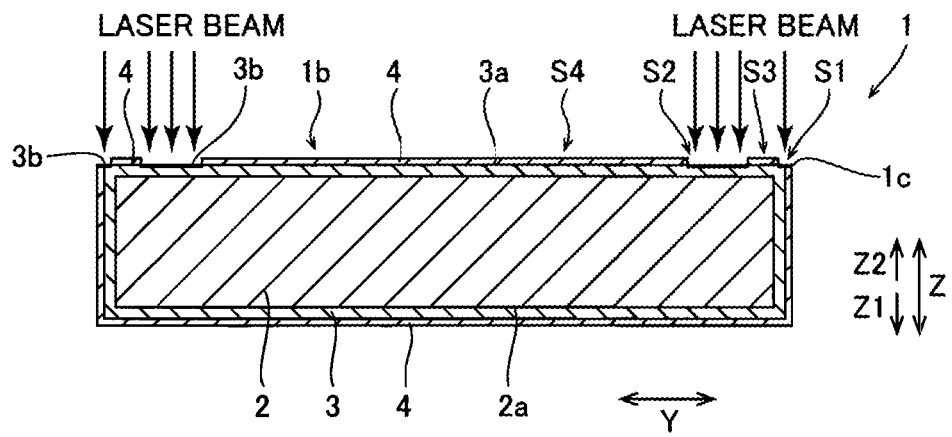
FIG. 6 is a sectional view for illustrating laser trimming performed on the hermetic sealing cap according to the first embodiment of the present invention.

In the manufacturing method according to the first embodiment, the surface 3a of the Ni plated layer 3 is exposed in the oxidized regions S1 and S2 on the side of the sealing surface 1b by laser trimming, as shown in FIG. 6. Specifically, the Au plated layer 4 of the oxidized region S1 located at and near the outer end 1c, adjacent to the outside of the solder region S3 is removed in the ring shape, employing a laser using YVO$_4$ (Yttrium Vanadium tera Oxide) as a medium. At this time, the Au plated layer 4 is removed in the ring shape such that the width W2 (see FIG. 4) of the oxidized region S1 is at least about 30 µm and not more than about 60 µm. At the same time, the Au plated layer 4 of the oxidized region S2 adjacent to the inside of the solder region S3 is removed in the ring shape. At this time, the Au plated layer 4 is removed in the ring shape such that the width W3 (see FIG. 4) of the oxidized region S2 is about 100 µm. The surface 3a of the Ni plated layer 3 exposed by removing the Au plated layer 4 is oxidized in a short time by heat generated by laser emission. Thus, in the oxidized regions S1 and S2, the surface 3a of the Ni plated layer 3 is oxidized, and the oxide film layer 3b is formed. In this manner, the hermetic sealing cap 1 according to the first embodiment of the present invention is formed.

Thus, employing the laser, the Au plated layer 4 of the oxidized region S1 located at and near the outer end 1c, adjacent to the outside of the solder region S3 is removed in the ring shape, and the Au plated layer 4 of the oxidized region S2 adjacent to the inside of the solder region S3 is removed in the ring shape. At this time, the oxide film layer 3b that is oxidized is formed on the surface 3a of the Ni plated layer 3 exposed by removing the Au plated layer 4. Thus, the Au plated layer 4 of the oxidized region S1 and the Au plated layer 4 of the oxidized region S2 can be easily removed without forming masks or the like on portions where the Au plated layer 4 is not removed, and corrosion of the Ni plated layer 3 and the Au plated layer 4 caused by a reagent employed to remove the masks can be suppressed. Furthermore, no step of oxidizing the surface 3a of the Ni plated layer 3 exposed separately may be required, and hence the manufacturing process can be simplified.

The oxide film layer 3b that is oxidized is formed on the surface 3a of the Ni plated layer 3 by the heat generated by laser emission, whereby the oxide film layer 3b can be easily formed, utilizing the heat generated by laser emission.

Furthermore, the thickness t3 (about 0.02 µm) of the Au plated layer 4 is rendered smaller than the thickness t2 (at least about 2 µm and not more than about 3 µm) of the Ni plated layer 3, whereby the Au plated layer 4 can be easily removed by the laser to expose the Ni plated layer 3, and the heat generated by laser emission can be effectively employed for oxidation reaction of the surface 3a of the Ni plated layer 3.

Figure 7:
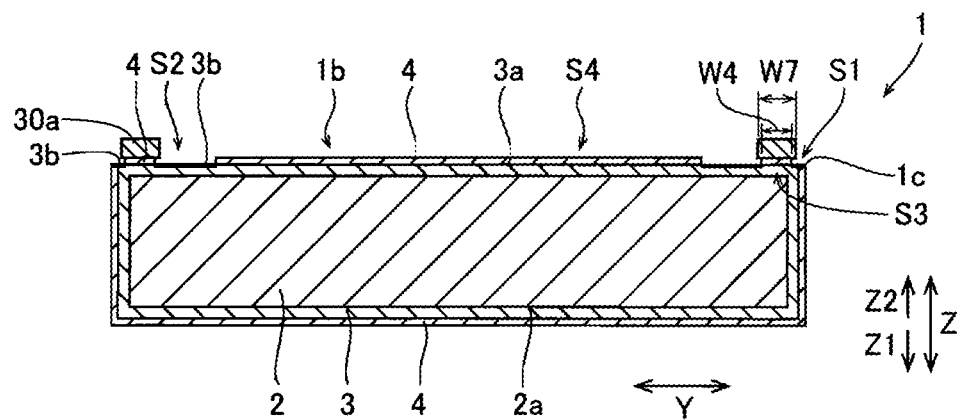
FIG. 7 is a sectional view for illustrating a step for forming a solder layer on the hermetic sealing cap according to the first embodiment of the present invention.

Then, in the ring-shaped solder region S3 adjacent to the inside of the oxidized region S1, a solder ring 30a made of Au—Sn alloy containing about 80 mass % of Au is arranged on the upper surface of the Au plated layer 4, as shown in FIG. 7. This solder ring 30a has a width W7 of about 100 µm larger than the width W4 (about 80 µm) of the solder region S3 and is arranged to cover the solder region S3 in a plan view.

Then, the solder ring 30a is melted at a temperature of at least about 280° C. and not more than about 320° C. in an atmosphere of a N$_2$ gas and a H$_2$ gas, whereby the solder layer 30 having a prescribed thickness is formed on the solder region S3, as shown in FIGS. 3 and 4. Although not shown in the drawings, the Au plated layer 4 on the solder region S3 is diffused into the solder layer 30 made of Au—Sn alloy, and hence the actual solder layer 30 appears to be formed on the surface 3a of the Ni plated layer 3.

Thereafter, the electronic component housing member 20 in which the tungsten layer 23, the Ni—Co alloy layer 24, and a Au layer (not shown) are formed in this order on the upper surface of the ceramic frame body 22 arranged on the ceramic substrate 21, as shown in FIG. 1, is prepared. Then, the electronic component 10 having the bumps 11 is mounted on the upper surface of the ceramic substrate 21. Then, the solder layer 30 of the hermetic sealing cap 1 formed by the aforementioned method is arranged in contact with the upper surface of the ceramic frame body 22. Thereafter, the solder layer 30 is remelted at a temperature of at least about 280° C. and not more than about 310° C. in a vacuum, whereby the hermetic sealing cap 1 is bonded to the upper surface of the ceramic frame body 22. At this time, the unshown Au layer is diffused into the solder layer 30 made of Au—Sn alloy. In this manner, the electronic component housing package 100 according to the first embodiment of the present invention is formed.

(Second Embodiment)

A second embodiment is now described with reference to FIGS. 8 and 9. According to this second embodiment, in addition to the aforementioned structure according to the first embodiment, protrusion regions S2b are provided in regions corresponding to corners 1a in an oxidized region S2a of a hermetic sealing cap 201.

Figure 8:
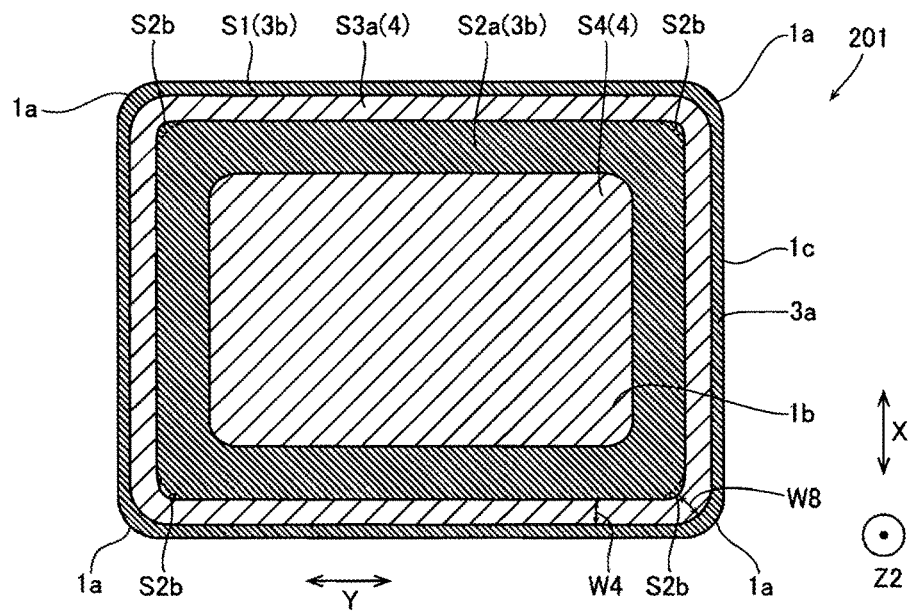
FIG. 8 is a plan view showing a hermetic sealing cap according to a second embodiment of the present invention.
Figure 9:
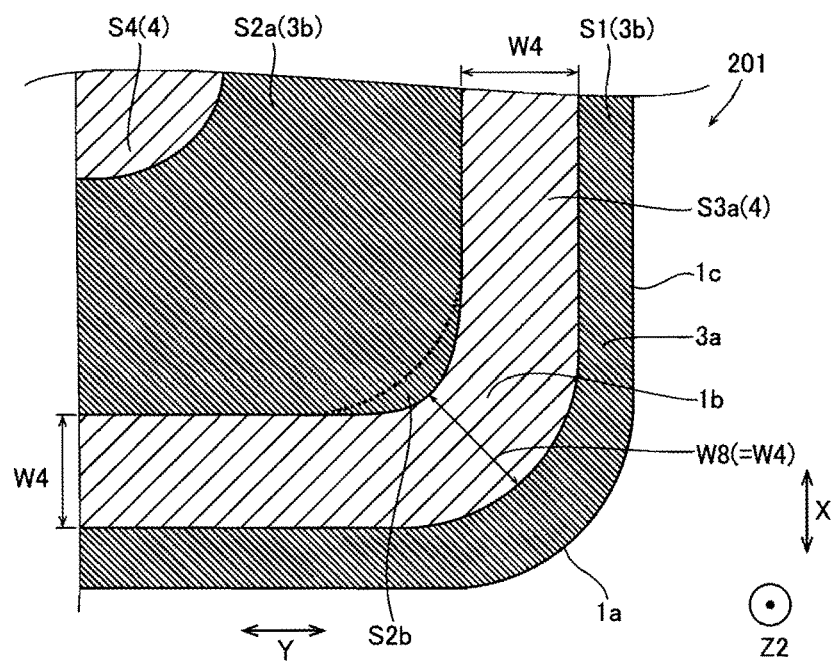
FIG. 9 is an enlarged plan view showing a protrusion region of the hermetic sealing cap according to the second embodiment of the present invention.

The hermetic sealing cap 201 according to the second embodiment of the present invention is sectioned into four regions of an oxidized region S1, the oxidized region S2a, a solder region S3a, and a plated region S4, as shown in FIG. 8. In the oxidized region S2a, a Au plated layer 4 is removed to expose a surface 3a of a Ni plated layer 3, and the exposed surface 3a of the Ni plated layer 3 is oxidized to form an oxide film layer 3b. The oxidized region S2a and the solder region S3a are examples of the "third region" and the "first region" in the present invention, respectively.

According to the second embodiment, the protrusion regions S2b are formed in the four regions of the ring-shaped oxidized region S2a corresponding to the four corners 1a of a base material 2. These protrusion regions S2b are formed to protrude outward (toward an outer end 1c) to the corners 1a from the oxidized region S2 (dashed portion) according to the aforementioned first embodiment, as shown in FIG. 9. Thus, in the regions corresponding to the four corners 1a, the oxidized regions S2a expand outward, and hence the widths of regions corresponding to the four corners 1a are reduced in the solder region S3a adjacent to the outside of the oxidized region S2a. At this time, the width W8 of the solder region S3a in the regions corresponding to the corners 1a is rendered substantially equal to the width W4 (about 80 μm) of the solder region S3a in a region other than the regions corresponding to the corners 1a.

The remaining structure of the hermetic sealing cap 201 and the remaining method for manufacturing the hermetic sealing cap 201 according to the second embodiment are similar to those according to the aforementioned first embodiment, and hence the description is omitted.

According to the second embodiment, as hereinabove described, in the oxidized region S1 outside the solder region S3a, the Au plated layer 4 is removed to expose the surface 3a of the Ni plated layer 3, and the exposed surface 3a of the Ni plated layer 3 is oxidized to form the oxide film layer 3b lower in wettability to solder than the Au plated layer 4. Thus, spread of part of melted solder to the outer surface of the hermetic sealing cap 201 can be suppressed, and hence a reduction in the amount of solder of the solder region S3a can be suppressed. Furthermore, a region inside the solder region S3a is sectioned into the plated region S4 not adjacent to the solder region S3a and the oxidized region S2a adjacent to the solder region S3a, the Au plated layer 4 inside the solder region S3a is removed while the Au plated layer 4 of the plated region S4 not adjacent to the solder region S3a is left to expose the surface 3a of the Ni plated layer 3 in the oxidized region S2a, and the exposed surface 3a of the Ni plated layer 3 is oxidized to form the oxide film layer 3b lower in wettability to solder than the Au plated layer 4. Thus, the reduction in the amount of the solder of the solder region S3a can be suppressed. In addition, the Au plated layer 4 of the plated region S4 not adjacent to the solder region S3a is left, whereby the corrosion resistance can be improved in the plated region S4 not adjacent to the solder region S3a (inside the oxidized region S2a) while the spread of the solder is suppressed in the oxidized region S2a adjacent to the solder region S3a inside the solder region S3a.

According to the second embodiment, the protrusion regions S2b protruding outward (toward the outer end 1c) to the corners 1a are formed in the four regions of the ring-shaped oxidized region S2a corresponding to the four corners 1a of the base material 2. Thus, the oxidized region S2a can be increased in size in the regions corresponding to the corners 1a of the hermetic sealing cap 201, and hence the solder region S3a adjacent to the outside of the oxidized region S2a can be reduced in size. Thus, a large amount of solder of a solder layer 30 can be inhibited from being provided in the regions of the solder regions S3a corresponding to the corners 1a, and hence the thickness of the solder in the regions corresponding to the corners 1a can be inhibited from exceeding the thickness of the solder in a region other than the corners 1a.

The remaining effects of the second embodiment are similar to those of the aforementioned first embodiment.

The embodiments disclosed this time must be considered as illustrative in all points and not restrictive. The range of the present invention is shown not by the above description of the embodiments but by the scope of claims for patent, and all modifications within the meaning and range equivalent to the scope of claims for patent are further included.

For example, while the solder layer is formed in the hermetic sealing cap in order to bond the hermetic sealing cap to the electronic component housing member in each of the aforementioned first and second embodiments, the present invention is not restricted to this. According to the present invention, no solder layer may be formed in the hermetic sealing cap in order to bond the hermetic sealing cap to the electronic component housing member. In this case, ring-shaped solder may be arranged between the solder region and the upper surface of the electronic component housing member and may be melted when the hermetic sealing cap is bonded to the electronic component housing member.

While the width W2 (at least about 30 μm and not more than about 60 μm) of the ring-shaped oxidized region S1 outside the solder region S3 is rendered smaller than the width W4 (about 80 μm) of the ring-shaped solder region S3 in the aforementioned first embodiment, the present invention is not restricted to this. According to the present invention, the width W2 of the oxidized region S1 may alternatively be rendered at least the width W4 of the solder region S3. In this case, the large oxidized region S1 can be ensured, and hence the spread of the solder in the oxidized region S1 can be more reliably suppressed. Consequently, the part of the melted solder can be further inhibited from reaching the outer surface of the hermetic sealing cap.

While the width W3 (about 100 μm) of the ring-shaped oxidized region S2 inside the solder region S3 is rendered larger than the width W2 (at least about 30 μm and not more than about 60 μm) of the ring-shaped oxidized region S1 outside the solder region S3 in the aforementioned first embodiment, the present invention is not restricted to this. According to the present invention, the width W3 of the oxidized region S2 may alternatively be rendered not more than the width W2 of the oxidized region S1. In this case, the large plated region S4 can be ensured, and hence the corrosion resistance can be improved in the wide range inside the solder region S3.

While the width W3 (about 100 μm) of the ring-shaped oxidized region S2 inside the solder region S3 is rendered larger than the width W4 (about 80 μm) of the ring-shaped solder region S3 in the aforementioned first embodiment, the present invention is not restricted to this. According to the present invention, the width W3 of the oxidized region S2 may alternatively be rendered not more than the width W4 of the solder region S3. In this case, the large plated region S4 can be ensured, and hence the corrosion resistance can be improved in the wide range inside the solder region S3.

While inside the solder region S3, the plane area occupied by the plated region S4 inside the oxidized region S2 is rendered larger than the plane area occupied by the oxidized region S2 in the aforementioned first embodiment, the present invention is not restricted to this. According to the present invention, the plane area occupied by the plated region S4 may alternatively be rendered not more than the plane area occupied by the oxidized region S2. In this case, the plane area occupied by the oxidized region S2 can be increased, and hence the spread of the solder can be further suppressed in the oxidized region S2.

While the Au plated layer less oxidized than the Ni plated layer is formed on the surface of the Ni plated layer in each of the aforementioned first and second embodiments, the present invention is not restricted to this. According to the present invention, a plated layer made of another metal high in wettability to solder may alternatively be formed on the surface of the Ni plated layer.

While the solder of Au—Sn alloy containing about 80 mass % of Au is employed for the solder layer 30 in each of the aforementioned first and second embodiments, the present invention is not restricted to this. According to the present invention, Au—Sn alloy having a Au content other than about 80 mass % may alternatively be employed as the solder of the solder layer, or solder having a composition other than Au—Sn alloy may alternatively be employed.

While the base material 2 made of Fe—Ni—Co alloy is employed in each of the aforementioned first and second embodiments, the present invention is not restricted to this. According to the present invention, a base material made of a member other than Fe—Ni—Co alloy, such as Fe—Ni alloy, for example, may alternatively be employed. In this case, the base material is preferably made of a material having a thermal expansion coefficient close to the thermal expansion coefficient of the electronic component housing member made of an insulating material such as alumina since a reduction in the sealability resulting from a difference in thermal expansion can be suppressed.

While the hermetic sealing cap 1 is made of the rectangular (quadrilateral) flat plate in each of the aforementioned first and second embodiments, the present invention is not restricted to this. According to the present invention, the hermetic sealing cap may alternatively be made of a flat plate in a shape such as a circular, elliptic, or polygonal shape, other than a rectangular shape.

What is claimed is:

1. A hermetic sealing cap employed for an electronic component housing package including an electronic component housing member configured to house an electronic component, comprising a base material, a first plated layer formed on a surface of a base material, and a second plated layer formed on a surface of the first plated layer, wherein a surface of the base material is sectioned into
a first region covered with the second plated layer to be bonded with the electronic component housing member through solder,
a second region completely covered with the second plated layer,
a third region separating the first region and the second region, and
a fourth region surrounding the first region along an outer end of the base material in a plan view,
wherein, the second region is located inside the first region, and in the third region and the fourth region being not covered with the second plated layer, the first plated layer is exposed and oxidized.

2. The hermetic sealing cap according to claim 1, wherein the first region and the fourth region are ring-shaped in the plan view, and
a separate distance between an outer peripheral edge and an inner peripheral edge of the fourth region that is ring-shaped is smaller than a separate distance between an outer peripheral edge and an inner peripheral edge of the first region that is ring-shaped.

3. The hermetic sealing cap according to claim 1, wherein the third region and the fourth region are ring-shaped in the plan view, and
a separate distance between an outer peripheral edge and an inner peripheral edge of the fourth region that is ring-shaped is smaller than a separate distance between an outer peripheral edge and an inner peripheral edge of the third region that is ring-shaped.

4. The hermetic sealing cap according to claim 1, wherein the first region and the third region are ring-shaped in the plan view, and
a separate distance between an outer peripheral edge and an inner peripheral edge of the third region that is ring-shaped is larger than a separate distance between an outer peripheral edge and an inner peripheral edge of the first region that is ring-shaped.

5. The hermetic sealing cap according to claim 1, wherein in a region inside the first region, a plane area occupied by the second region is larger than a plane area occupied by the third region.

6. The hermetic sealing cap according to claim 1, wherein in the plan view, the base material has a quadrilateral shape, and the third region is ring-shaped, and
a protrusion region protruding toward a corner of the base material is formed in a region of the third region corresponding to the corner.

7. The hermetic sealing cap according to claim 1, wherein the first plated layer comprises a Ni plated layer, and the second plated layer comprises a Au plated layer.

8. The hermetic sealing cap according to claim 7, wherein the solder made of Au-Sn alloy is arranged on a surface of the second plated layer of the first region.

9. An electronic component housing package comprising:
an electronic component housing member housing an electronic component; and
a hermetic sealing cap sealing the electronic component housing member, the hermetic sealing cap including a base material, a first plated layer formed on a surface of the base material, and a second plated layer formed on a surface of the first plated layer,
wherein a surface of the base material is sectioned into
a first region covered with the second plated layer bonded with the electronic component housing member through solder, a second region completely covered with the second plated layer, a third region separating the first region and the second region, and a fourth region surrounding the first region along an outer end of the base material in a plan view, wherein the second region is located inside the first region, and in the third region and the fourth region being not covered with the second plated layer, the first plated layer is exposed and oxidized.

10. The electronic component housing package according to claim 9, wherein the first region and the fourth region are ring-shaped in the plan view, and a separate distance between an outer peripheral edge and an inner peripheral edge of the fourth region that is ring-shaped is smaller than a separate distance between an outer peripheral edge and an inner peripheral edge of the first region that is ring-shaped.

11. The electronic component housing package according to claim 9, wherein the third region and the fourth region are ring-shaped in the plan view, and a separate distance between an outer peripheral edge and an inner peripheral edge of the fourth region that is ring-shaped is smaller than a separate distance between an outer peripheral edge and an inner peripheral edge of the third region that is ring-shaped.

12. The electronic component housing package according to claim 9, wherein the first region and the third region are ring-shaped in the plan view, and a separate distance between an outer peripheral edge and an inner peripheral edge of the third region that is ring-shaped is larger than a separate distance between an outer peripheral edge and an inner peripheral edge of the first region that is ring-shaped.

13. The electronic component housing package according to claim 9, wherein in a region inside the first region, a plane area occupied by the second region is larger than a plane area occupied by the third region.

14. The electronic component housing package according to claim 9, wherein in the plan view, the base material has a quadrilateral shape, and the third region is ring-shaped, and a protrusion region protruding toward a corner of the base material is formed in a region of the third region corresponding to the corner.

15. The electronic component housing package according to claim 9, wherein the first plated layer comprises a Ni plated layer, and the second plated layer comprises a Au plated layer.

16. The electronic component housing package according to claim 15, wherein the solder made of Au-Sn alloy is arranged on a surface of the second plated layer of the first region.

* * * * *